United States Patent [19]

Lee et al.

[11] 4,144,493
[45] Mar. 13, 1979

[54] INTEGRATED CIRCUIT TEST STRUCTURE

[75] Inventors: James H. Lee, Wappingers Falls, N.Y.; Bernd K. S. Lessmann, Magstadt, Fed. Rep. of Germany; Akella V. Satya, Wappingers Falls, N.Y.

[73] Assignee: International Business Machines Corporation, Armonk, N.Y.

[21] Appl. No.: 701,388

[22] Filed: Jun. 30, 1976

[51] Int. Cl.² .......................... G01R 31/26; H01L 7/02
[52] U.S. Cl. .................................. 324/158 R; 29/574; 324/51; 324/158 T
[58] Field of Search ........... 324/158 R, 158 D, 158 T, 324/51; 29/574; 357/40

[56] References Cited

U.S. PATENT DOCUMENTS

| | | | |
|---|---|---|---|
| 3,507,036 | 4/1970 | Antipov et al. | 29/574 |
| 3,851,245 | 11/1974 | Baker et al. | 324/158 R |
| 3,974,443 | 8/1976 | Thomas | 324/158 R |
| 3,983,479 | 9/1976 | Lee et al. | 324/51 |

OTHER PUBLICATIONS

Ghatalia et al; "Semiconductor Process Defect Monitor"; IBM Tech. Dis. Bull.; vol. 17; No. 9; Feb. 1975; pp. 2577-2578.

*Primary Examiner*—Rudolph V. Rolinec
*Assistant Examiner*—Ernest F. Karlsen
*Attorney, Agent, or Firm*—Thomas F. Galvin

[57] ABSTRACT

A complex test structure for integrated, semiconductor circuits in which the impurity regions of the test device are elongated, preferably in serpentine fashion. The elongated impurity regions emulate corresponding regions in regular integrated circuit devices. Additional regions are provided, each in elongated form, which, when impressed with appropriate voltages or currents, provide indications of defect levels and product yield in the regular devices. Advantageously, the serpentine test structure is fabricated on the same wafer and with the same process steps as the regular integrated circuit chips. In one embodiment, a plurality of such monitors are provided adjacent each other in the same test site. Regions in one monitor are selectively connected to regions in another monitor and to external contact pads by contact stations disposed between each monitor.

20 Claims, 10 Drawing Figures

INTEGRATED CIRCUIT TEST STRUCTURE

CROSS-REFERENCE TO A RELATED APPLICATION

This application is related to application Ser. No. 598,480, filed July 23, 1975 in the names of Ghatalia et al, now U.S. Pat. No. 3,983,479 and assigned to the same assignee as the present application.

BACKGROUND OF THE INVENTION

1. Field of the Invention

This invention is directed to the testing of monolithic integrated circuits, particularly complex bipolar transistors. In particular, it relates to test circuits fabricated concurrently with the monolithic circuits. 2. Description of the Prior Art In the manufacture of semiconductor integrated circuits, it has become common to fabricate test structures during the manufacturing process which serve to yield reliability data on the regular circuits. The principal reason for this is that the integrated circuits themselves cannot be probed because the interconnections of the impurity regions and the devices formed thereby are neither accessible electrically nor can the regions be isolated from one another to provide accurate data. The typical monolithic integrated circuit involves such a dense pattern of impurity regions and metallurgy interconnecting them that the components cannot be readily isolated for testing purposes. Thus, semiconductor designers have found it necessary to design test structures which are isolated from the production circuits which can be tested. One such test site is described, for example, in the patent issued in the names of I. Antipov et al., U.S. Pat. No. 3,507,036, which is assigned to the assignee of the present application.

This type of product-representative structure designed closely to real products requires numerous outgoing contacts, complicated testing and covers too little semiconductor area. Thus, it is relatively ineffective for detecting and monitoring low manufacturing defect levels which are typical of today's products.

The importance of ascertaining and correcting manufacturing defect levels in high density integrated circuits cannot be overemphasized. The defect levels not only affect process yields, but may result in the premature abandonment of a particular process or product in its early stages. Even if such drastic measures do not occur, unchecked defect levels may force systems developers to implement more redundancies and error correction controls, i.e., to redesign around the defect or to cause a recalculation of the acceptable quality levels which are not 100% testable.

It is therefore most important that a product assurance or product test group be able to make continuous in-line measurement of these defect levels during the manufacturing process, enabling the detection of the most important types of defects in order to accumulate know how to sort out the most critical defects and to cure them.

In the above referenced related application of Ghatalia et al., Ser. No. 598,480, there is described a defect monitoring structure employing a series of electrically testable serpentine stripe patterns having different widths and spacings to determine the distribution of defect density. The structure allows the determination of defects such as opens and shorts in diffusions and metallization as well as pin holes in insulation layers. As a defect monitor, the structure measures the primary reliability parameters of relatively simple semiconductor structures, such as field effect transistors. However, the defect monitor described by Ghatalia et al cannot be utilized for monitoring all of the important regions of highly complex integrated circuits such as bipolar transistor circuits, in particular buried regions such as subcollector diffusions, dielectric isolation regions and buried isolation regions.

SUMMARY OF THE INVENTION

It is therefore an object of our invention to provide an improved semiconductor defect monitoring structure which permits testing for defects which may occur in the manufacture of highly complex semiconductor devices.

It is a further object of our invention to reveal defect densities by type in a bipolar process technology.

It is a further object of this invention to provide a unified test site which is capable of supplying data on numerous types of defects.

These and other objects of our invention are achieved in a test monitor which comprises a set of impurity regions in a semiconductor chip, each region being elongated, preferably in serpentine fashion. Tests may be performed at various stages of device production, primarily after the first level of metallization atop the structure, through test pads provided at the periphery of the monitor. The physical analysis of failures, i.e., tests requiring sectioning or like, are for the most part no longer needed.

The defect monitors are, in effect, "stretched" versions of bipolar transistors, Schottky Barrier Diodes, resistors which include other, non-corresponding regions to achieve both maximized, separated defect density measurements by type and by device layer as well as special test information which it is not otherwise possible to obtain.

By the term "elongated" or "stretched" impurity regions, we mean regions which have the same width (cross-section) and depth as similar regions in regular semiconductor devices, but which are substantially longer.

Prior art test structures have been specially designed to uncover particular, identified types of defects. Each newly-identified type of defect required a newly designed structure. Our invention, on the other hand, remains useful for monitoring newly-identified defects because the cross-section of the elongated structure emulates the regular device structure. Moreover, even where process changes are made in the manufacture of the regular structure, no spcial analysis is required to redesign the test structure — the same process changes are made in both.

One feature of our invention provides both for monitoring defects in dielectric isolation regions which separate the semiconductor doped impurity regions as well as for monitoring defects in isolation regions which comprise both dielectric and junction isolation areas. Generally, this is accomplished by providing metal gates over the dielectric isolation regions to permit bias or stress testing.

Another feature includes the addition of impurity regions in the test monitor, and not found in the regular structures, for detecting defects caused by mask misalignment. This is accomplished by measuring punch-through voltages.

Still another feature is the provision of a plurality of defect monitor structure which are selectively interconnected by means of contact stations to reduce the number of contact pads which would ordinarily be required for complete testing.

BRIEF DESCRIPTION OF THE DRAWINGS

The specific nature of the invention, as well as other objects, aspects, uses and advantages thereof, will clearly appear from the following description and from the accompanying drawings, in which.

DESCRIPTION OF THE PREFERRED EMBODIMENT

Figure 1:
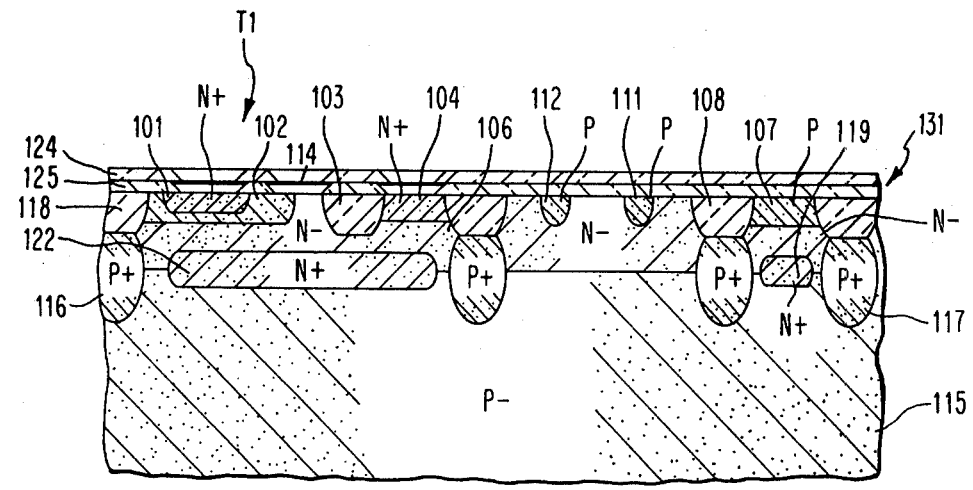
FIG. 1 illustrates a prior art bipolar integrated circuit structure.

Turning now to FIG. 1, the cross-section of a semiconductor chip includes a bipolar transistor T1, a Schottky Barrier Diode region 114 and three resistors 111, 112 and 107, which are commonly fabricated by ion implantation. The devices illustrated in FIG. 1 are interconnected with thousands of similar devices within the same semiconductor substrate 115 to form either logic or memory integrated circuits. It is these types of regular circuits which the novel defect monitor of our invention is intended to emulate for defect monitoring purposes.

Transistor T1 comprises an N+ emitter region 101 formed in a P type base region 102, which in turn is disposed within an N- epitaxial region 106. The subcollector of the transistor comprises N+ region 122. Region 104 serves as a contact region for connecting the collector metallization (not shown) to the N+ subcollector 122. Region 104 is preferably formed at the same time as N+ emitter region 101. Alternatively, region 104 could be formed as a reach-through to the N+ subcollector 117. The N+ and P type regions are typically comprised of arsenic and boron, respectively.

Region 114 adjacent base region 102 is utilized to provide a Schottky Barrier Diode. Typically, the diode is formed by the provision of a metal silicide, such as platinum silicide, and a thicker layer of metallization such as aluminum, aluminum doped with copper or aluminum-copper-silicon. For ease of illustration the metallization layers, which are by this time well known to those of skill in the semiconductor art, are not illustrated.

Dielectric isolation region 103 serves to isolate N+ region 104 from the Schottky Barrier Diode region 114. Dielectric isolation region 118 and junction isolation region 116 surrounds the transistor regions to isolate T1 from the remainder of the devices formed in substrate 115. Dielectric regions 124 and 125 disposed atop the substrate are silicon nitride and silicon dioxide, respectively, in the preferred embodiment.

As noted previously, the resistors are advantageously formed by ion implantation techniques which are known in the art. Diffusion could also be used. Resistors 111 and 112 differ from 107 in that the former are fabricated using the dielectric layers 124 and 125 as the mask to confine the effective resistor action to the selected areas of region 106. Resistor 107, on the other hand, is defined by the dielectric isolation region 108. The ion implantation may take place either directly through regions 124 and 125 or with these layers completely removed over that area of the epitaxial region in which resistor 107 is formed.

Figure 2A:
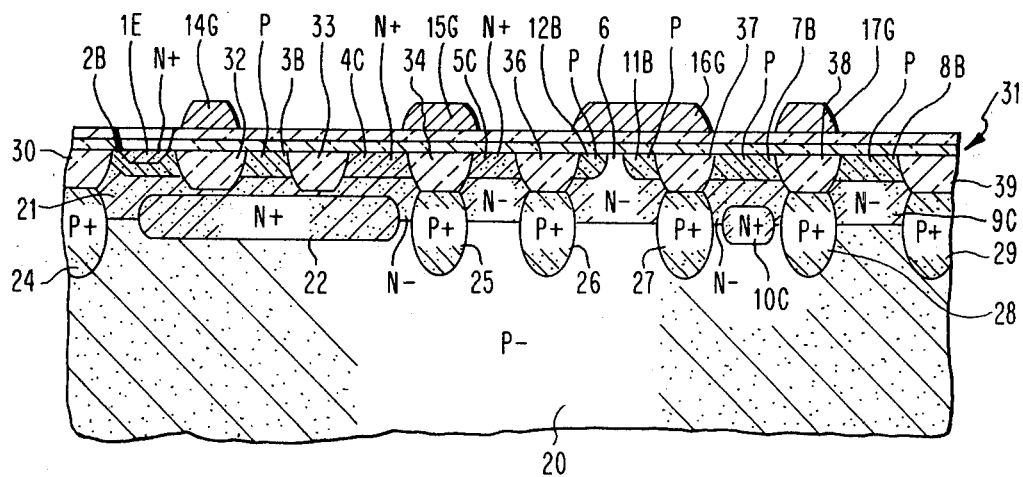
FIGS. 2 and 2A illustrate plan and cross-sectional views, respectively, of a portion of our novel test structure.
Figure 2:
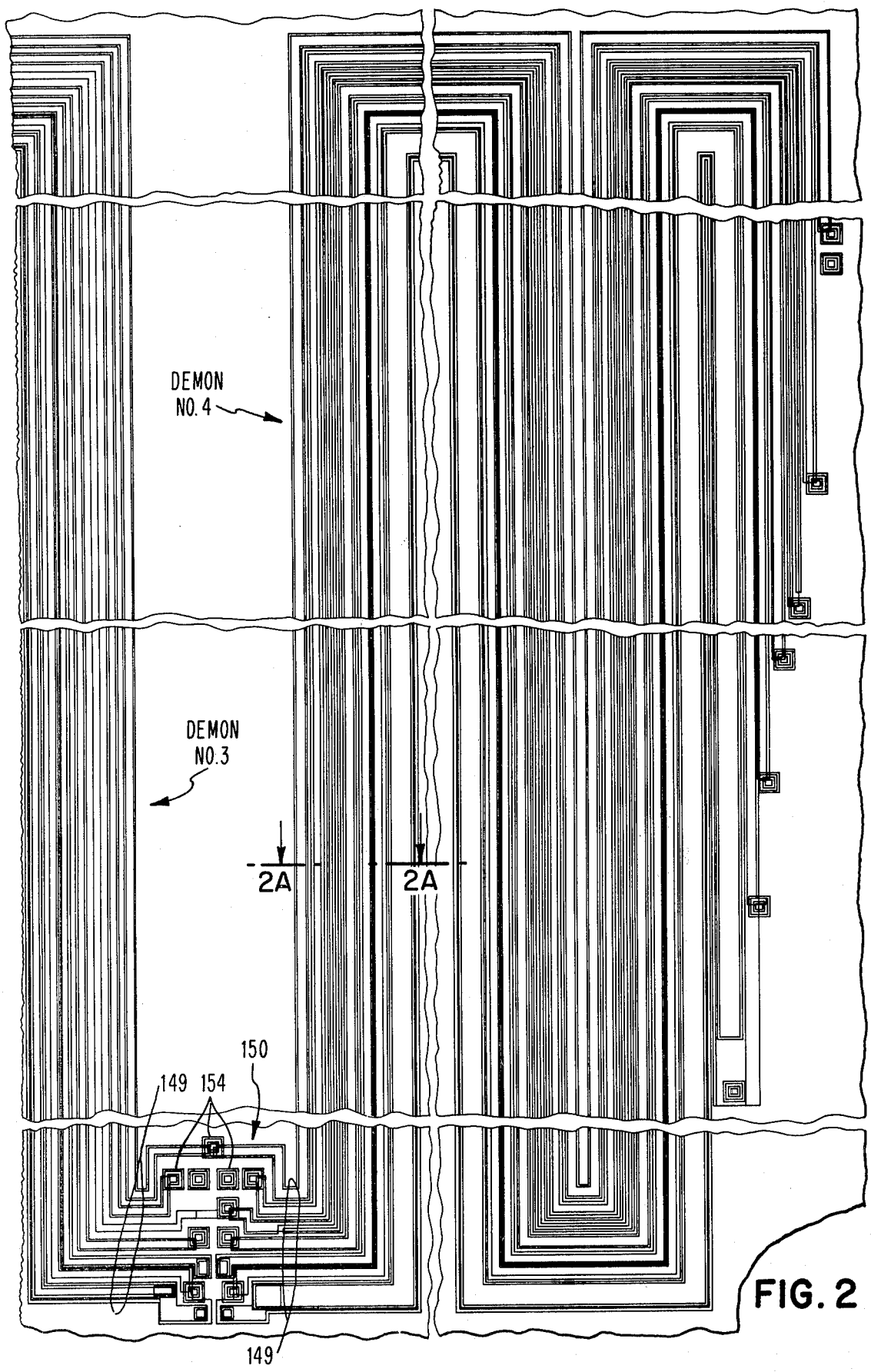

FIGS. 2 and 2A illustrate the novel defect monitor of our invention. Comparison of FIGS. 1 and 2A demonstrates that the structures are quite similiar insofar as the types of impurity regions and their width are concerned. However, it will also be immediately apparent to those of skill in the semiconductor art that there are significant difference between the two. One significant difference is the elongated nature of the impurity regions. This type of structure has already been disclosed in the above-referenced Ghatalia et al. application as a means for estimating the density of defects in regular devices, such as field effect transistors.

As described in the above-referenced Ghatalia et al. application, a "defect" is any deviation from the design shape being fabricated as, for example, an extension, a notch, or the like. A "fault" is any defect which causes a loss of function such as opens or shorts. Below a specific size, a defect cannot be a fault. The "critical area" is that area within which the center of a defect must fall to produce a fault. It is assumed that the defect producing mechanisms act uniformly over the surface of the semiconductor wafer and with equal intensity on a wafer by wafer basis. The Poisson probability density function then describes yield loss due to "random defects".

$$f(x) = \frac{\lambda^t \cdot e^{-\lambda}}{} \qquad t = 0,1,2... \qquad (1)$$

$\lambda$ = the expected number of faults/chip
$t$ = the actual number of faults/chip But by our definition of "fault", it can be seen that we have "yield" or "good chips" only when $t = 0$. Thus, $$Y = e^{-\lambda} \qquad (2)$$

By our definition of "defect" and "critical area", the expected number of faults per chip ($\lambda$) is simply the product of average defect density (d) and critical area (A). Therefore, $$Y = e^{-\lambda} = e^{-dA} \qquad (3)$$

The average critical area, $\overline{A}$, for defects $\geq w$ is given by the following expression:

$$\overline{A} = \int_\omega^\infty A(x)dx = 1 \cdot w \qquad (4)$$

Thus, the average critical area for monitors of the "long thin type" as shown in FIG. 2A is given by 1·w. Therefore, when these monitors are tested for both continuity and shorts, "monitor yield" can be determined as follows:

$$G/N = Y = d^{-dA} = e^{-d(1 \cdot w)} \qquad (5)$$

where
G = the number of good monitors,

N = the total number of monitors, 1 = the length of the monitor, and
w = the width of the monitor.
Solving the above equation for d, we arrive at the following express $$d = -\ln Y/l \cdot w \qquad (6)$$

where d is the density of defects of size ≧ w.

Using this expression, one can also determine the density defect of any size by a plurality of monitors of different widths on each integrated circuit chip to permit regression analysis to determine the relationship between defect density and defect size.

Certain of the novel aspects of our structure as compared to the Ghatalia et al. application and other prior art designs are found in FIG. 2A, as well as in other Figures related to FIG. 2A which will be described in a later section of the specification.

A significant difference between the regular integrated circuit devices illustrated in FIG. 1 and the defect monitor of FIG. 2A, aside from the elongation, is the provision of an added P-type "base" impurity region 3B. This permits the detection of defects in elongated isolation region 32, which emulates isolation region 103 in FIG. 1. Regions 1E, 2B, 4C, 32, 21 and 22 in FIG. 2A correspond to regions 101, 102, 104, 103, 106 and 122, respectively, in FIG. 1. Region 3B and others like it are termed "non-corresponding" regions.

Another related modification comprises elongated metallic stripes 14G, 15G, 16G and 17G disposed atop certain of the dielectric isolation regions. These also permit the detection of dielectric isolation defects, as well as leakage through the isolation regions.

Another significant modification is the provision of a buried N+ region 10C under a P-type region 7B for monitoring defects in subcollctor-type regions. Region 10C is advantageously formed simultaneously with region 22 (FIG. 2A) and regions 122 and 119 (FIG. 1).

N type resistor region 5C and P type resistor region 7B are provided in epitaxial region 21 without subcollector (buried N+) regions thereunder to produce pinch-off resistors. Punch-through can be detected in the event of mask misalignment.

Regions 11B and 12B are two elongated P type diffusions which comprise two elongated resistors in N-epitaxial region 21. Metal gate 16G extends over the P type regions as well as the dielectric isolation 37 and is separated therefrom by the composite insulator 31 which is typically silicon dioxide and silicon nitride. This permits measurement of both parasitic leakage without providing a bias on metal gate 16G as well as the measurement of a parasitic $V_t$ with a bias on metal gate 16G.

All of the modifications mentioned above as well s others are discussed in greater detail in later sections of the specification.

FIG. 2 is a plan view of a portion of a single defect monitor, termed DEMON No. 4, which is formed as a test site in a semiconductor wafer. FIG. 2A, already discussed above, is a cross-sectional view taken along line 2A of FIG. 2. FIG. 2 is a pen recording of the DEMON as fabricated on a semiconductor chip, but with some sections removed. Because of the incredible density of the impurity regions within each defect monitor structure, it is not possible to illustrate even a single such structure completely on a patent drawing. Thus, it became necessary to delete portions of the structure in FIG. 2. However, the general layout is well illustrated.

Each DEMON comprises basically a set of impurity and isolation regions formed in contiguous fashion in the substrate. Each region is elongated, or "stretched", to provide a greatly increased area in which defects may occur. The elongated regions run in serpentine fashion to provide the most efficient utilization of the area available in the chip. This layout provides for extremely dense packing of contiguous regions. In an actual device, the width of a typical impurity region varies from 0.15 mil to around 0.5 mil. With the serpentine layout, the length of an impurity region in one DEMON is around 0.450 inches. Thus, region 1E in FIGS. 2 and 2A would be 0.15 mils wide and 450 mils long in one of the DEMONS, whereas emitter region 101 of transistor T1 in FIG. 1 would be 0.15 by 0.15 mils square.

Disposed adjacent DEMON No. 4 is another similar monitor, termed DEMON No. 3. Intermediate the DEMONS is a region 150, termed a contact station, where inner terminals 149 of the elongated impurity regions of the DEMONS may be interconnected. Via contact regions 154 are also provided at contact station 150 for connecting the impurity regions to surface wiring, illustrated in FIG. 3. Contacts are also provided at the right-hand edge of DEMON No. 4 for connecting the outer terminals of the elongated regions to surface wiring.

Figure 3:
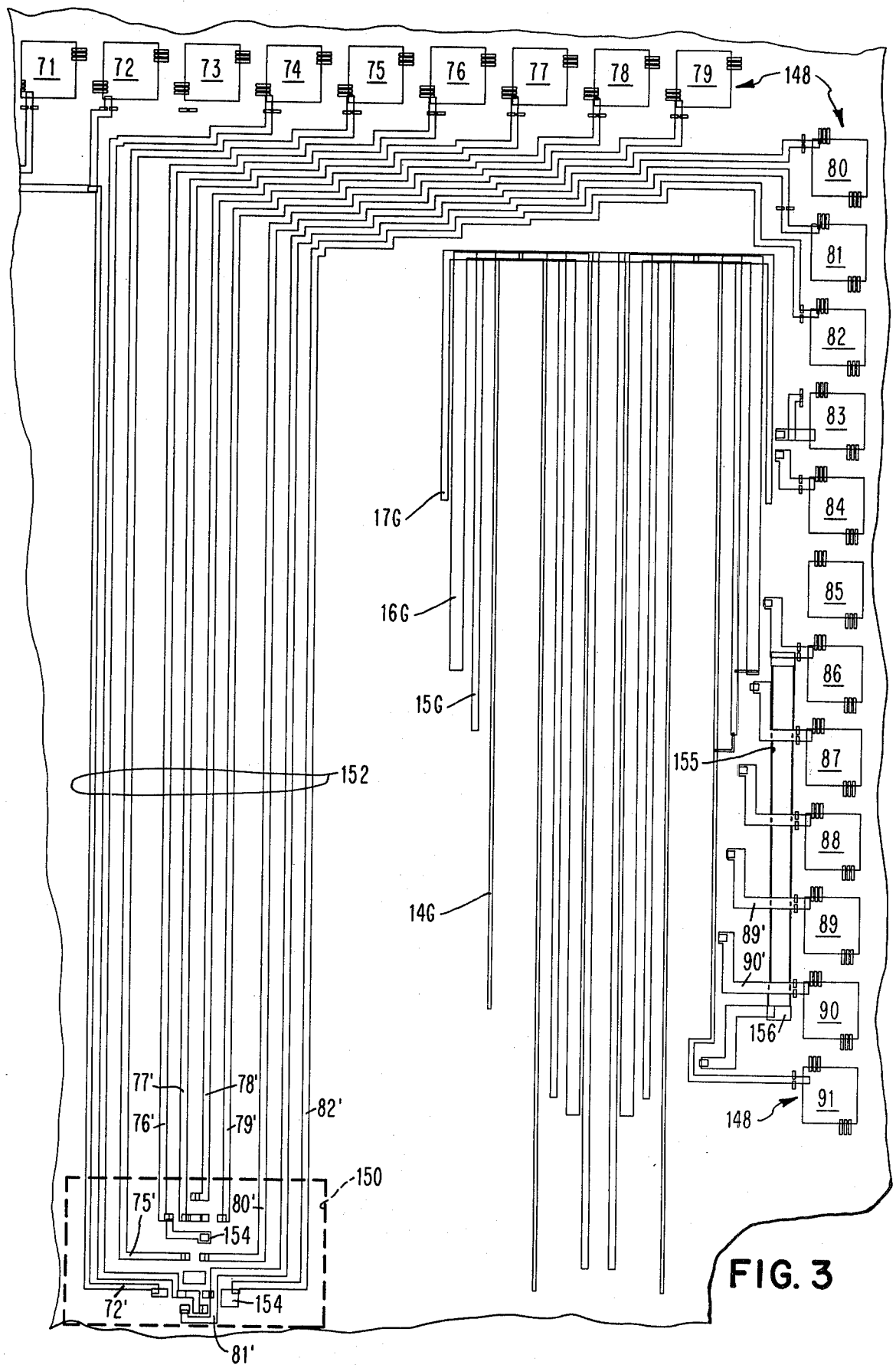
FIG. 3 is a plan view of the first level wiring of a portion of our test structure.

FIG. 3 is an overlay of the first level of metallization associated with DEMON No. 4. Like FIG. 2, FIG. 3 is a pen recording; however, the scale of FIG. 2 is greater than that of FIG. 3. Contact pads 148 are disposed around the periphery of the DEMON atop surface insulator 31. The pads are interconnected to the inner impurity regions by means of the surface wiring 152, via connections 154 through surface insulator 31, and terminals 149. As already noted, area 150 between adjacent DEMONs is termed a "contact station", which performs a dual function. The station serves both to connect the surface wiring 152 of the contact pads 148 to selected impurity regions of adjacent DEMONs as well as to interconnect directly impurity regions of adjacent DEMONs. The layout illustrated in FIGS. 2 and 3 is believed to represent the most compact and efficient test site and defect monitor yet constructed.

Each contact pad is numbered in accordance with its enumeration in an actual test chip. The surface wiring associated with a pad is identified as the pad number is primed. Pads 83, 84, 86–90 connect to impurity regions at the outer terminals of DEMON No. 4, each of these contacts being electrically connected to one of the impurity regions within the substrate. Pad 85 is a contact for substrate 20. Underpass resistor 153 connects pad 86 with contact 156. This connection serves to connect the outer terminals of impurity regions 7B and 2B in DEMON No. 4.

Contact pads 76–82 are electrically connected to impurity regions at the other, inner terminals of DEMON No. 4. Contact pads 72, 74–77 and 81 are connected to the inner terminals 149 of DEMON No. 3 disposed adjacent DEMON No. 4. Pad 73 makes contact to substrate 20. As previously noted, certain metallic lands 152 and also contacts 154 are used to interconnect an impurity region of one DEMON with an impurity region of another. For example, metallic stripe 77' associated with contact pad 77 performs this function. As will be explained in greater detail, these interconnections may be to like impurity regions in adjacent DEMONs or to dissimilar regions in adjacent DEMONs.

In FIG. 3, pad 91 is connected to all of the metal gates disposed atop the insulator, i.e., gates 14G, 15G, 16G and 17G. Thus, these gates are biased simultaneously, to conserve contact pads. It will be appreciated that the contact pads and the wiring patterns which interconnect the pads to the impurity regions within the semiconductor substrate take up a substantial amount of space which could otherwise be used for the impurity regions within the substrate. This is just as true for test sites as it is for regular devices. Thus, any structure or technique which serves to reduce the number of contact pads or the number of land patterns is quite advantageous.

Figure 4:
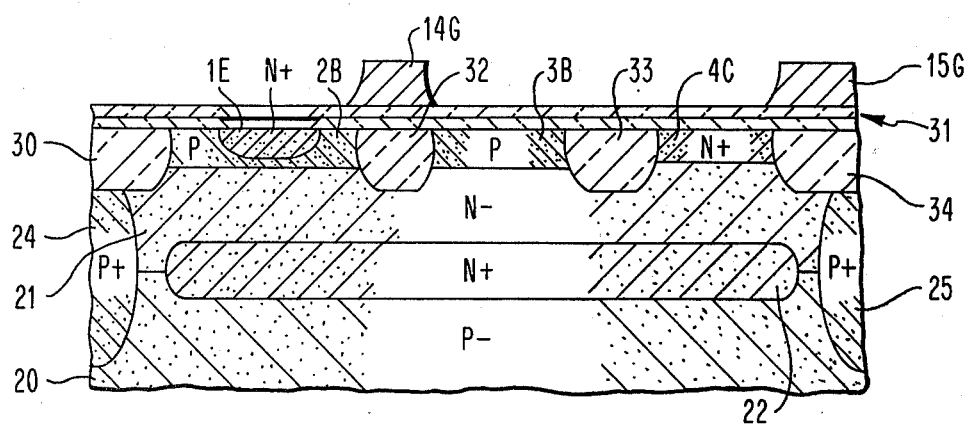
FIGS. 4, 5, 6 and 7 are portions of the structure of FIG. 2A to better describe the invention.

Turning now to FIG. 4 there is illustrated a portion of the test site of FIG. 2A. As previously noted, this portion of the test site contains an extra, i.e., non-corresponding base region 3B which is separated from the standard base region 2B by dielectric isolation region 32. Regions 2B and 3B are of the same conductivity type. In addition, metallic stripe 14G is disposed over isolation region 32 and separated therefrom by dielectric layer 31.

We have found that measuring defects both in dielectric isolation regions alone as well as in dielectric regions disposed atop junction isolation regions can be done effectively only indirectly through shorts in neighboring conductive lines or neighboring impurity regions. Thus, the added impurity region 3B and the gate metal 14G provides means for measuring both opens (pinholes) and leakage (shorts) in region 32. Table I shows the electric potentials required to measure opens and leakage in region 32. Thus, to measure for a pinhole through region 2B is grounded, region 3B has a current forced therein of around 500 microamperes with gate 14G left floating, i.e., no bias applied. Measurement is taken cross regions 2B and 3B; if the potential drop is less than 100 millivolts the dielectric isolation 32 is defective. If, however, the voltage drop is greater, no defect is indicated.

To measure leakage current under isolation region 32, a 5 volt bias is applied to gate 14G, region 2B is grounded and region 3B is biased at −2 volts. The bias on line 14G might tend to invert N region 21 at the lower surface of region 32 if charges are available within the region. Leakage current can then flow through region 32 and be measured directly.

TABLE I-continued

| Defect to be Measured | Electrical Conditions Applied | Measurement |
| --- | --- | --- |
| Leakage in Region 32 | Gate 14G: 5 volts; 2B: Ground; 3B −2 volts. | Leakage Current |

It will be understood by those skilled in the art that the specific values of electric potentials and current and the values measured are given by way of example only.

Figure 5:
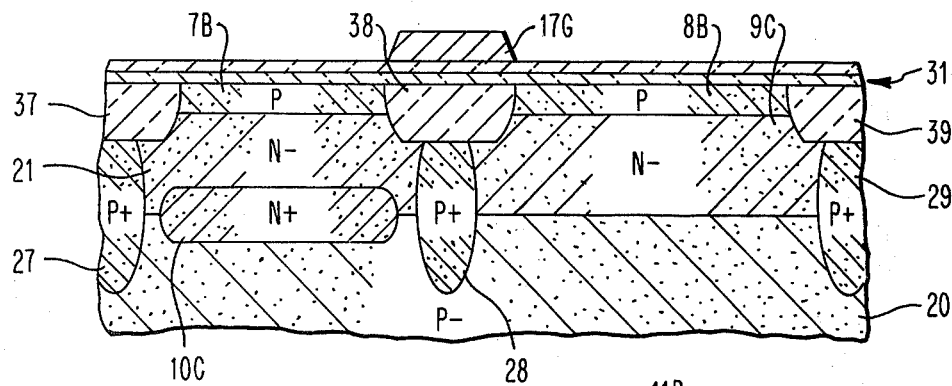

Turning now to FIG. 5, another portion of the overall cross-section of FIG. 2A is illustrated. This portion of the device is designed to reveal inter alia, problems associated with the junction isolation regions, as illustrated by region 28. In addition, misalignment between regions at different levels in the substrate can be detected.

In this structure, a pair of P type (base) regions 7B and 8B are provided in epitaxial region 21. A buried subcollector-type region 10C is provided beneath base 7B; but none is provided beneath base 8B. This diffusion permits the detection and measurement of subcollector to dielectric isolation misalignment, which is indicated when a low breakdown voltage is detected. These regions are also classified as non-corresponding regions.

For example, in determining any misalignment of the subcollector 10C with respect to junction isolation 28 a reverse current of, say, 1 microamp is passed through region 10C to substrate 20. No connection is needed to region 28. A breakdown voltage across regions 10C and 20 of less than around 4V indicates that regions 10C and 28 are too close to each other.

The distance between regions may also be determined by making pinch-off resistance measurements. For example, the distance between regions 8B and 28 may be determined by measuring the pinch-off resistance of region 9C. For example, with a one microamp reverse current applied between regions 8B and 28 (as provided through substrate 20), the pinch-off voltage, $V_{Po}$, between regions 8B and 20 is an indication of the distance across N- region 9C between regions 8B and 28. A series of such readings may be made by changing the bias applied to region 9C.

Numerous different measurements may be made in this area of the defect monitor. Certain significant ones are shown in Table II, which follows the same general format as in Table I.

TABLE II

| Defect to be Measured | Electrical Conditions Applied | Measurement |
| --- | --- | --- |
| Subcollector region-junction isolation region misalignment. | Current between 10C and substrate 20 at +1 microamp. | Breakdown voltage between 10C and substrate 20. |
| Junction isolation region-dielectric isolation region misalignment. | Current between 8B and substrate 20 at −1 microamp 9C: grounded. | Voltage between 8B and substrate 20, $V_{pt}$ (punch-through voltage). |
| Microphase leakage due to boron in region 28 diffusing into region 38. | Gate 17G: 5 volts; Bias between 10C and 9C at 2 volts. | Leakage current. |
| Pinch-off resistance of region 9C. | Current between 8B and substrate 20 at −1 microamp; 9C: variable bias. | Voltage between 8B substrate 20, $V_{po}$ (pinch-off voltage). |
| Pinch-off resistance of region 10C. | Current between 7B and substrate 20 at −1 microamp; 10C: variable bias. | Voltage between 7B and substrate 20, $V_{po}$. |

TABLE I

| Defect to be Measured | Electrical Conditions Applied | Measurement |
| --- | --- | --- |
| Open in Dielectric Isolation Region 32 | 2B:Ground; 3B:$V_E$ . I(500µa); Gate 14G floating | Direct short: <100 mv |

Figure 6:
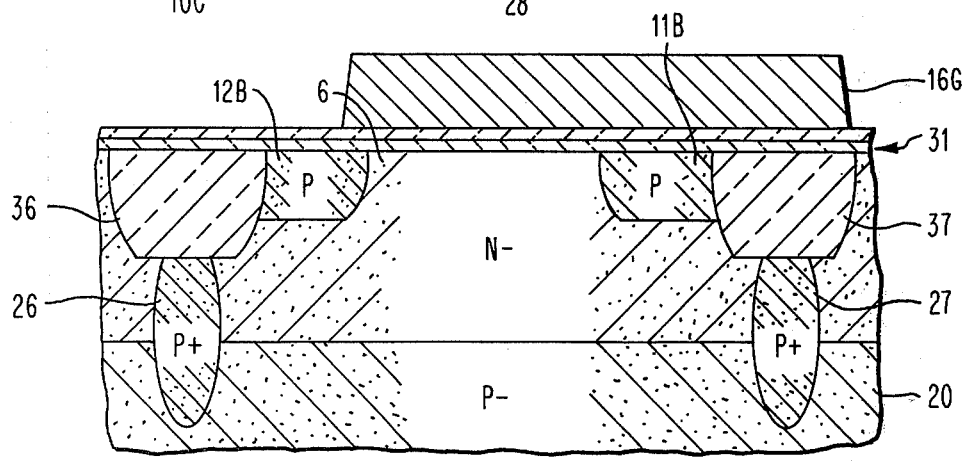

Turning to FIG. 6, in this region a pair of resistor regions 11B and 12B are formed in the N-epitaxial region 21, typically by diffusion.

In bipolar-type devices which utilize resistors associated with the transistors and diodes, a first level of metallization, emulated by gate 16G, is often designed to be disposed above the resistors. Field effect transistor action may be initiated, causing current to flow between the resistor regions. Metal gate 16G is provided over both the elongated dielectric isolation region 37 as well as over the composite insulator 31 which covers the "channel" region between 11B and 12B. This is, in effect, a "stretched" MNOS Field Effect Transistor and permits both the measurement of parasitic leakage between resistors 11B and 12B without a bias on gate 16G as well as the parasitic threshold voltage, $V_T$, with a bias on gate 16G. Regions 11B and 12B are formed in a single DEMON only, viz., DEMON No. 4.

Figure 7:
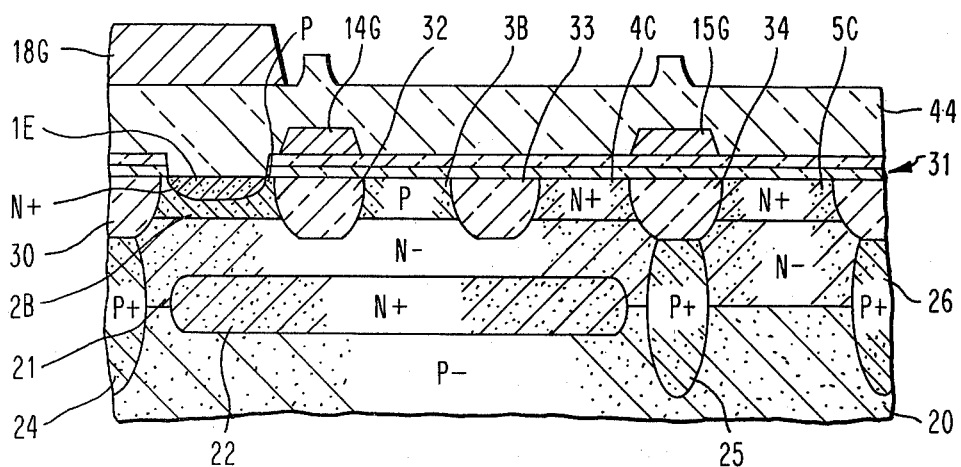

FIG. 7 illustrates a structure which is similar to that in FIG. 3 with the addition of a first level of quartz 44 and a second level of metallization 18G. Gate 18G is disposed over emitter region 1E for the detection of incomplete coverage of quartz layer 42 over unused emitter 1E i.e., these emitters which are not contacted by a metal layer. If there is a defect of this type, a contact through quartz layer 44 will occur between gate 18G and emitter 1E.

Region 5C in FIG. 7 is an added N-type resistor without a subcollector-type region disposed thereunder. Region 5C is contiguous to dielectric isolation region 34 and is opposite region 4C, which emulates reach-through region 104 of the regular transistor (FIG. 1). As such, N type elongated regions 4C and 5C are similar to P type elongated regions 7B and 8B in FIG. 5. The same types of measurements of both misalignment of the various levels as well as microphase leakage explained in Table II above may thus be taken. For example, microphase leakage caused in dielectric isolation 34 by P+ junction region 25 may be detected between regions 4C and 5C.

Figure 8:
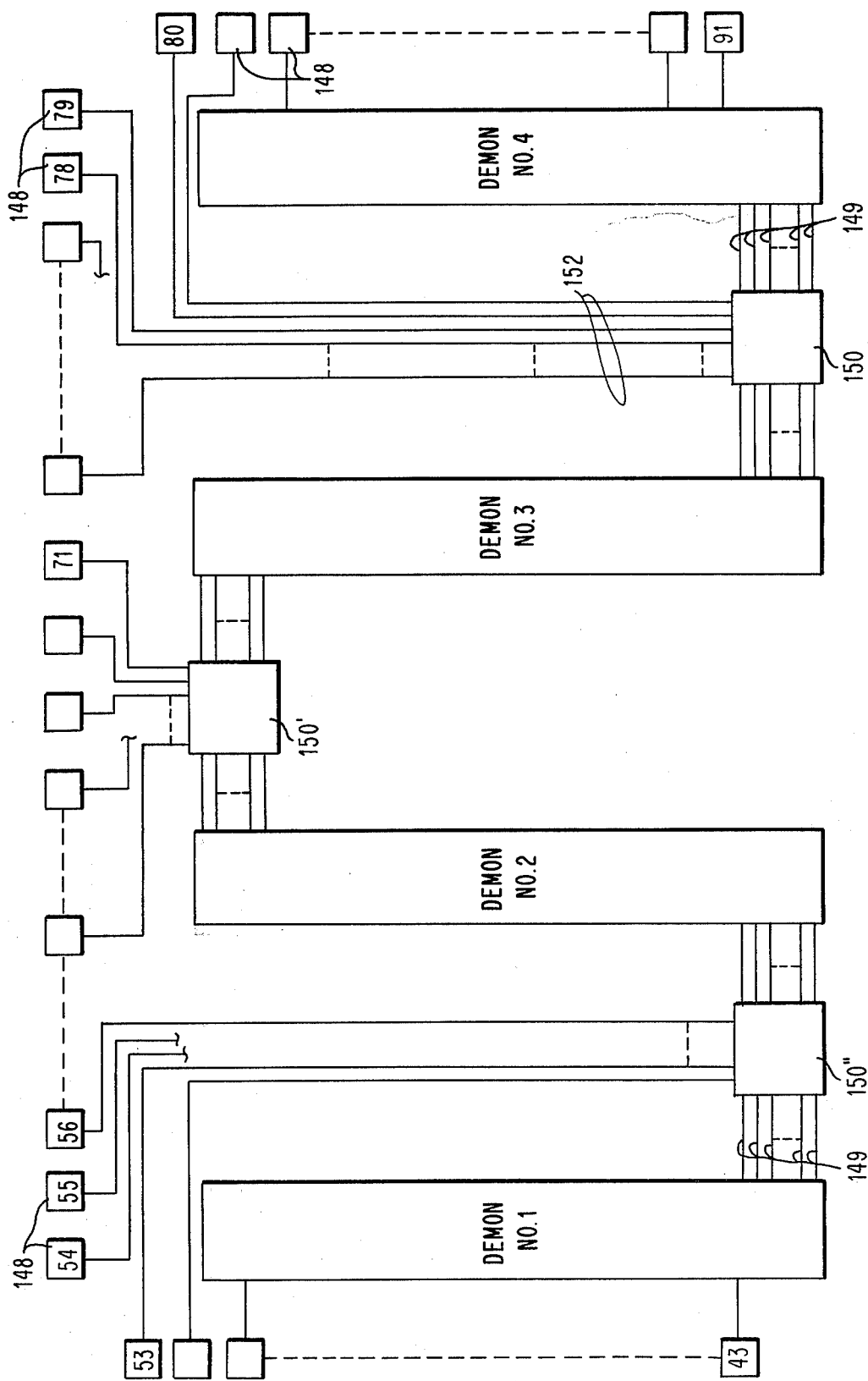
FIG. 8 illustrates the overall layout of our test site.

FIG. 8 illustrates the overall layout, in schematic form, of that portion of the semiconductor chip which contains our novel defect monitor structures. In the preferred embodiment there are four individual defect monitors enumerated DEMON No. 1, No. 2, No. 3 and No. 4. The DEMONs are disposed adjacent each other and, as previously discussed, each DEMON includes a plurality of coextensive, serpentine impurity regions and isolation regions within the substrate. Contact pads 148 are disposed at the periphery of the structures for providing external contacts to the terminals 149 of the elongated regions. Typically, when testing the structures a set of probes makes contact to each of the contact pads to perform electrical testing. The probes are electrically connected to sophisticated test systems which are known in the testing part, for forcing voltages and currents through the pads into the regions and for sensing voltages, currents and resistivities. In modern semiconductor manufacturing systems such tests are performed automatically with the aid of computers.

Each DEMON encompasses the same area, being about 80 mils long and 35 mils wide. Obviously, the DEMONs could have different areas if desired; however, from the standpoint of mathematical analysis, design and computerized wiring processes, it is much more advantageous to make each DEMON as similar as possible.

The differences between the DEMONs lie in the width and spacings of the impurity and dielectric regions. Table III illustrates the differences in width, length and spacing of both the impurity and isolation regions within each DEMON:

TABLE III

| IMPURITY REGION | DEMON No. 1 | No. 2 | No. 3 | No. 4 |
|---|---|---|---|---|
| Width | 0.150 mils | 0.250 mils | 0.350 mils | 0.450 mils |
| Spacing | 0.450 mils | 0.350 mils | 0.250 mils | 0.150 mils |
| Length | 450.0 mils | 410.0 mils | 410.0 mils | 450.0 mils |

As already has been described in the above-referenced Ghatalia et al application, variations in line width and spacing permit the use of regression formulae for determining defect size distribution.

Contact stations, denoted 150, 150′, and 150″ are disposed between each of the DEMONs. These test stations, which have been more clearly illustrated in FIGS. 2 and 3 above, serve both to interconnect impurity regions 149 as well as to connect contact pads 148 to the impurity regions by means of surface wiring 152.

The test site layout in FIG. 8 is very compact. As will be recognized by semiconductor designers, the contract pads take up a substantial amount of space and testing is often limited to the number of pads which can be provided on the test site. By providing the contact pads at the periphery of the test site, and making interconnections by means of the test stations between the structures, many more pads can be used in a single test pass than in previous test site designs.

Rather than using the contact pads directly to make interconnections between different impurity regions in the DEMONs, all of the interconnections are made at the "centrally located" contact stations. The space required for the contact stations is substantially less, as they consist merely of the group of contact connections between first level wiring and the impurity regions within the substrate which are made between adjacent DEMONs. This geometrical design, as well as the wiring rules which we establish for interconnecting the impurity regions, achieve the aforementioned compact layout. These rules are discussed with respect to FIG. 9, which shows the interconnection of contest pads to the terminals of the impurity regions in the DEMONs.

Figure 9:
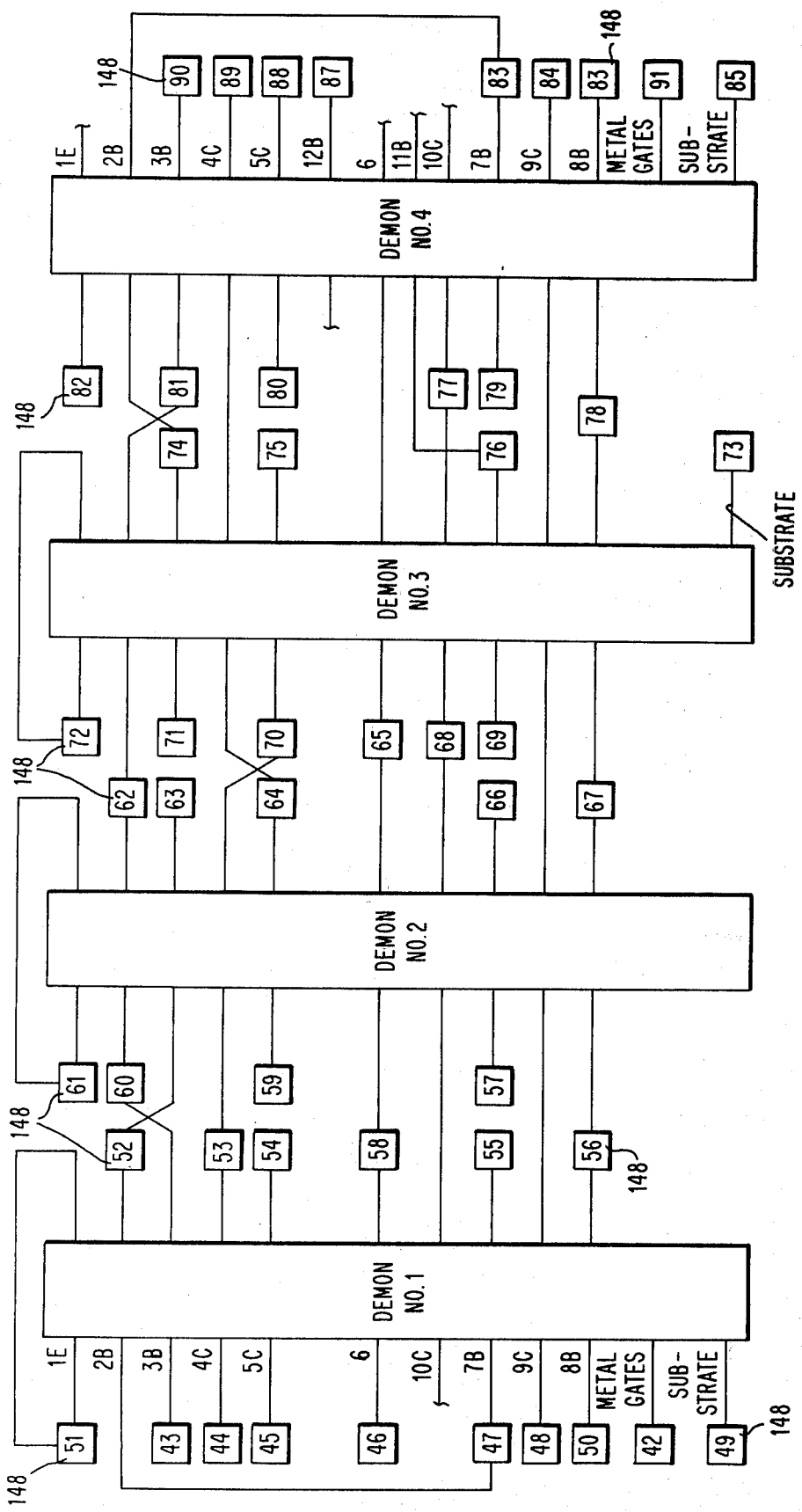
FIG. 9 is a schematic representation of the connection of the contact pads to the plurality of defect monitors used in our preferred embodiment.

FIG. 9 does not conform to the actual physical layout of the monitoring structure. Rather, it is a modified schematic to better illustrate the aforementioned interconnections. The impurity regions 1E, 2B, . . . 8B are illustrated in the same order as they are actually disposed in the semiconductor substrate. Thus FIG. 9 conforms to FIG. 2A. Pads 148, on the other hand, have been rearranged to better show how they serve to interconnect impurity regions in adjacent DEMONS.

In the standard test site, one contact pad would be required for each terminal of each impurity region in each DEMON in order to measure open regions and shorts between regions. In addition, contact pads are required for the metal gates and the substrate.

However, we have used a number of techniques to substantially reduce the number of contact pads. These are discussed below with respect to FIG. 9.

Because the elongated emitters 1E are completely contacted by metallization as ohmic contacts, only a single contact pad rather than two is required for each such region. The contact pads are wired to both ends of regions 1E in DEMON Nos. 1, 2 and 3 to ensure the detection of shorts along its entire length between it and another region, such as 4C. Thus, pad 51 contacts both ends of region 1E in DEMON No. 1. Region 1E in DEMON No. 4, on the other hand, is so wide that no opens are expected along its length. However, pad 82 need contact it at one terminal only.

Elongated P type resistor regions are provided only in DEMON No. 4. Moreover, region 11B and 12B are connected only to pads 76 and 87, respectively. As discussed above with respect to FIG. 6, gate 16G is disposed above the resistors 11B and 12B, permitting the measurement of parasitic leakage between the resistors. For these types of measurements, only a single contact to regions 11B and 12B is needed. Moreover, region 11B shares pad 76 with region 7B because they are well isolated from one another.

Regions 2B and 7B are well isolated from one another in the substrate; and we have interconnected them at the outer terminals of DEMON Nos. 1 and 2 through pads 47 and 86, respectively. This allows a saving of two contact pads with no effect on the test data.

By connecting an impurity region in one DEMON with a like region in an adjacent DEMON as, for example, regions 4C in DEMON Nos. 1 and 2, only a single contact pad, rather than two, is needed at this intersection. The impurity regions disposed on either side of the so-connected regions remain unconnected, with a contact pad for each terminal. Obviously, opens in the connected regions are still uniquely detectable. So also are shorts between the adjacent regions.

For example, to test for a short between regions 5C and 4C through dielectric isolation region 34 in DEMON No. 1, a current could be forced through pad 45. A probe placed at pad 44 would detect a current induced in region 4C of DEMON No. 1. A short between regions 4C and 5C in DEMON No. 2 would cause no discrimination problem because pads 54 and 59 are unconnected. A similar layout is shown for regions 2B and 3B between DEMON Nos. 2 and 3.

Finally, dissimilar regions are interconnected by contact pads to conserve the total number required. For example, pad 60 interconnects region 3B in DEMON No. 1 with region 2B in DEMON No. 2. This allows us to test for defects in region 3B end-to-end in any one of the DEMONs without the need for a full compliment of eight pads.

The tests and measurements which we have described heretofore are by no means exhaustive. It will occur to those skilled in the art that numerous other tests may be performed using our defect monitor.

For example, measurements of the breakdown voltages between regions will yield information on aluminum spikes and pipes between such regions. Thus, a short under a reverse bias condition between regions 1E and 2B indicates the presence of spikes; and a low $BV_{CEX}$ measurement between regions 1E and 4C indicates the existence of pipes between region 1E and 4C through base region 2B in FIG. 4.

As another example, the measurement of excessive resistance within a selected region may indicate the presence of opens within the region. Thus a measurement of resistance taken from contact pads 71 and 74, i.e., through region 3B in DEMON No. 3, yields information on the existence of opens in the base region. Similar measurements may be made on regions 6, 7B and 8B.

While we have illustrated the fundamental novel features of our invention as applied to the preferred embodiments, it will be obvious that changes in form and detail may be made by those skilled in the art without departing from the spirit of the invention.

We claim:

1. A test structure in a semiconductor substrate for monitoring a plurality of regular monolithic integrated circuits, said test structure comprising:

a plurality of impurity regions which correspond to like impurity regions of said regular circuits with respect to relative disposition and conductivity within said substrate, said corresponding regions being elongated with respect to, but having the same depth and width as, said regular impurity regions; and at least one other elongated impurity region within said test structure not corresponding to any of said regular impurity regions for providing indications of defect levels in said regular circuits.

2. A test structure as in claim 1 wherein:

said regular circuits include dielectric isolation regions for isolating selected ones of said regular impurity regions;

said test structure includes an elongated dielectric isolation region corresponding to said regular dielectric isolation regions, said elongated isolation region being contiguous to an elongated impurity region which corresponds to one of said selected ones of said regular impurity regions.

3. A test structure as in claim 2 wherein:

said non-corresponding other impurity region is disposed contiguous to said elongated dielectric isolation region opposite from said corresponding elongated impurity region;

and further comprising:

an elongated conductive stripe disposed atop said elongated dielectric isolation region; and means for supplying electric potentials to said conductive stripe and said contiguous impurity regions, whereby shorts and leakage may be measured through said elongated dielectric isolation region.

4. A test structure as in claim 3 wherein:

said contiguous elongated impurity regions are of the same conductivity type.

5. A test structure as in claim 4 wherein:

said regular circuits include junction isolation regions disposed beneath said dielectric isolation regions; and said test structure includes an elongated junction isolation region disposed beneath said elongated dielectric isolation region.

6. A test structure as in claim 1 wherein:

said regular circuits include:

resistor regions; and conductive stripes disposed atop said resistor regions and insulated therefrom; and said test structure includes:

a pair of spaced elongated resistor regions corresponding to said regular resistor regions;

an elongated conductive stripe corresponding to said regular conductive stripes disposed atop both said elongated resistor regions and insulated therefrom.

7. A test structure as in claim 6 further comprising:

means for supplying electric potentials to said elongated conductive stripe, whereby the effects of said elongated stripe on said pair of elongated resistor regions may be measured.

8. A test structure as in claim 1 wherein:

one of said corresponding impurity regions is disposed at the surface of said substrate;

and further comprising:

a dielectric layer overlaying and in contact with said surface impurity region;
an elongated conductive stripe disposed over said dielectric layer and in line with said surface region; and
means for supplying a potential across said dielectric layer, whereby short circuits between said stripe and said surface region may be detected.

9. A test structure as in claim 1 wherein said at least one other non-corresponding elongated impurity region includes:
a pair of regions of the same conductivity type separated by an elongated dielectric isolation region, and
an elongated junction isolation region disposed beneath said dielectric isolation region.

10. A test structure as in claim 9 and further comprising:
means for providing current flow between one of said pair of regions and said junction isolation region and for measuring the voltage therebetween, whereby misalignment between said junction isolation and dielectric isolation region may be determined.

11. A test structure as in claim 9 further comprising:
an elongated buried region adjacent and spaced from said elongated junction isolation region and of opposite conductivity type thereto.

12. A test structure as in claim 11 further comprising:
means for providing current flow between said buried and junction isolation regions and for measuring the voltage therebetween, whereby misalignment between said buried junction isolation regions may be determined.

13. A test structure as in claim 1 wherein:
said test structure is substantially rectangular; and
each said elongated region forms a serpentine pattern.

14. A test site for semiconductor circuits comprising:
a set of monitoring structures disposed adjacent each other in a semiconductor substrate;
each said structure including a plurality of co-extensive, elongated impurity regions within said substrate;
contact pads located at the periphery of said structures for providing external contacts to the terminals of said elongated regions; and
contact stations disposed between said monitoring structures for selectively interconnecting said elongated regions and said contact pads.

15. A test site as in claim 14 wherein:
each said monitoring structure is substantially rectangular; and
each said elongated region forms a serpentine pattern.

16. A test site as in claim 14 further comprising:
at least one dielectric isolation region formed within said substrate and separating first and second elongated impurity regions in said monitoring structures;
at least one elongated, conductive stripe disposed atop at least one of said monitoring structures, over and coextensive with said dielectric isolation regions; and
another contact pad located at the periphery of said test site for providing an external contact to said conductive stripes.

17. A test site as in claim 16 wherein said first and second impurity regions are of the same conductivity type.

18. A test site as in claim 17 wherein:
said first impurity regions in adjacent monitoring structures are electrically unconnected;
each terminal of said first impurity region being connected to an associated contact pad;
said second impurity regions in adjacent monitoring structures are electrically connected;
the adjacent terminals of said second impurity regions being connected to a single contact pad.

19. A test site as in claim 17 wherein:
said first and second impurity regions in one monitoring structure are connected to said second and first impurity regions, respectively, in an adjacent monitoring structure by first and second contact pads, respectively.

20. A test site as in claim 14 wherein:
first impurity regions of one conductivity type at like locations in a pair of adjacent monitoring structures are electrically unconnected;
each terminal of said first regions being connected to an associated contact pad; and
second impurity regions of said one conductivity type at like locations in said pair of monitoring structures are electrically connected;
the adjacent terminals of said second regions being connected to a single contact pad;
whereby opens in each of said first and second regions and shorts therebetween may be electrically detected using a minimum number of contact pads.

* * * * *